United States Patent
Cho et al.

(10) Patent No.: US 11,763,987 B2
(45) Date of Patent: Sep. 19, 2023

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: A Ra Cho, Suwon-si (KR); Dong Hwi Shin, Suwon-si (KR); Seon Young Yoo, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/356,110

(22) Filed: Jun. 23, 2021

(65) Prior Publication Data

US 2022/0208451 A1  Jun. 30, 2022

(30) Foreign Application Priority Data

Dec. 30, 2020 (KR) .................. 10-2020-0187162

(51) Int. Cl.
| | |
|---|---|
| *H01G 4/30* | (2006.01) |
| *H01G 4/008* | (2006.01) |
| *H05K 1/11* | (2006.01) |
| *H05K 1/18* | (2006.01) |
| *H01G 4/232* | (2006.01) |

(52) U.S. Cl.
CPC ............ *H01G 4/008* (2013.01); *H01G 4/232* (2013.01); *H01G 4/30* (2013.01); *H05K 1/111* (2013.01); *H05K 1/181* (2013.01); *H05K 2201/10015* (2013.01)

(58) Field of Classification Search
CPC .......... H05K 1/181; H05K 1/111; H01G 4/30; H01G 4/232; H01G 4/008
USPC ........................................................ 174/260
See application file for complete search history.

(56) References Cited

U.S. PATENT DOCUMENTS

| | | |
|---|---|---|
| 2011/0149470 A1 | 6/2011 | Hur et al. |
| 2016/0268046 A1 | 9/2016 | Nishisaka et al. |

FOREIGN PATENT DOCUMENTS

| | | |
|---|---|---|
| KR | 10-2011-0072398 A | 6/2011 |
| KR | 10-2016-0110123 A | 9/2016 |

*Primary Examiner* — Tremesha S Willis
(74) *Attorney, Agent, or Firm* — Morgan, Lewis & Bockius LLP

(57) ABSTRACT

A multilayer capacitor and a board having the same mounted thereon are provided. The multilayer capacitor includes a capacitor body including a plurality of dielectric layers and a plurality of internal electrodes alternately disposed with each of the plurality of dielectric layers interposed therebetween, and an external electrode disposed on the capacitor body to be connected to the internal electrode. At least one intermetallic compound layer is disposed in a region in which the plurality of internal electrodes and the external electrode are connected, and a total number of the at least one intermetallic compound layer is more than or equal to 55% and less than 100% of a total number of the plurality of internal electrodes.

12 Claims, 5 Drawing Sheets

MULTILAYER CAPACITOR AND BOARD HAVING THE SAME MOUNTED THEREON

CROSS-REFERENCE TO RELATED APPLICATION(S)

This application claims the benefit of Korean Patent Application No. 10-2020-0187162, filed on Dec. 30, 2020 in the Korean Intellectual Property Office, the entire disclosure of which is incorporated herein by reference for all purposes.

TECHNICAL FIELD

The present disclosure relates to a multilayer capacitor, and a board having the same mounted thereon.

BACKGROUND

Multilayer Ceramic Capacitors (MLCC), components of passive devices, serve to control electrical signals, on circuits.

Such a multilayer capacitor has the advantage that it is small, has a high capacity and ease of mounting.

In recent years, as demand for industrial and electrical equipment as well as IT has increased, it has become necessary to develop products having stable electrical and mechanical properties and high reliability.

A multilayer capacitor may have cracks due to temperature change, substrate deformation, and moisture resistance factors after mounting thereof, and such cracks may cause product defects.

As a method for securing high reliability of such a multilayer capacitor, a technique of applying a conductive resin layer to an external electrode by absorbing tensile stress generated in mechanical or thermal environments is provided to prevent the occurrence of cracks caused by stress.

Such a conductive resin layer serves to electrically and mechanically bond a sintered electrode layer and a plating layer of the external electrode of the multilayer capacitor and to protect the multilayer capacitor from mechanical and thermal stress and bending impact of the substrate according to the process temperature during circuit board mounting.

However, in order to play this role, the resistance of the conductive resin layer should be relatively low, and the adhesion between the electrode layer and the plating layer should be excellent, to prevent a phenomenon of separation of the external electrode that may occur in the process.

However, a related art conductive resin layer has high resistance, and has a problem in which Equivalent Series Resistance (ESR) is higher than a product without a conductive resin layer.

SUMMARY

This summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

Exemplary embodiments provide a multilayer capacitor in which Equivalent Series Resistance (ESR) may be lowered while preventing cracking, and a board having the same mounted thereon.

According to an exemplary embodiment of the present disclosure, a multilayer capacitor may include a capacitor body including a plurality of dielectric layers and a plurality of internal electrodes alternately disposed with each of the plurality of dielectric layers interposed therebetween, and an external electrode disposed on the capacitor body to be connected to the plurality of internal electrodes. At least one intermetallic compound layer may be disposed in a region in which the plurality of internal electrodes and the external electrode are connected, and a total number of the intermetallic compound layer may be more than or equal to 55% and less than 100% of a total number of the plurality of internal electrodes.

The total number of the at least one intermetallic compound layer may be 55% to 99% of the total number of the plurality of internal electrodes.

A ratio of an average thickness of the at least one intermetallic compound layer to an average thickness of the plurality of internal electrodes may be 50% or more.

The capacitor body may include first and second surfaces opposing each other in a first direction, third and fourth surfaces opposing each other in a second direction, perpendicular to the first direction, and fifth and sixth surfaces opposing each other in a third direction, perpendicular to the first and second directions. In the third and fourth surfaces, a plurality of grooves may be disposed between the dielectric layers disposed in the first direction, and the at least one intermetallic compound layer may be disposed in the grooves.

An average depth of portions of the external electrode that diffuse to the plurality of internal electrodes, on connection portions between the plurality of internal electrodes and the external electrode, may be 30 μm or more.

An average depth of the plurality of grooves may be 30 μm or more.

The external electrode may include an electrode layer disposed on the capacitor body and in contact with the at least one intermetallic compound layer, and a conductive resin layer disposed on the electrode layer and including a plurality of metal particles, a conductive connection portion surrounding each of the plurality of metal particles and contacting the electrode layer, and a base resin.

The plurality of internal electrodes may include nickel, and the at least one intermetallic compound layer may include nickel-copper (Ni—Cu).

The plurality of metal particles of the conductive resin layer may include at least one of copper, nickel, silver, silver-coated copper, or tin-coated copper.

The plurality of metal particles of the conductive resin layer may have one of a spherical shape, a flake shape, or a mixture of the spherical shape and the flake shape.

The external electrode may further include a plating layer disposed on the conductive resin layer.

The plating layer may include a nickel plating layer and a tin plating layer, sequentially stacked on the conductive resin layer.

According to another exemplary embodiment of the present disclosure, a board having a multilayer capacitor mounted thereon includes a substrate having a plurality of electrode pads on one surface of the substrate, and the multilayer capacitor mounted on the substrate, wherein the external electrode is connected to the plurality of electrode pads.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
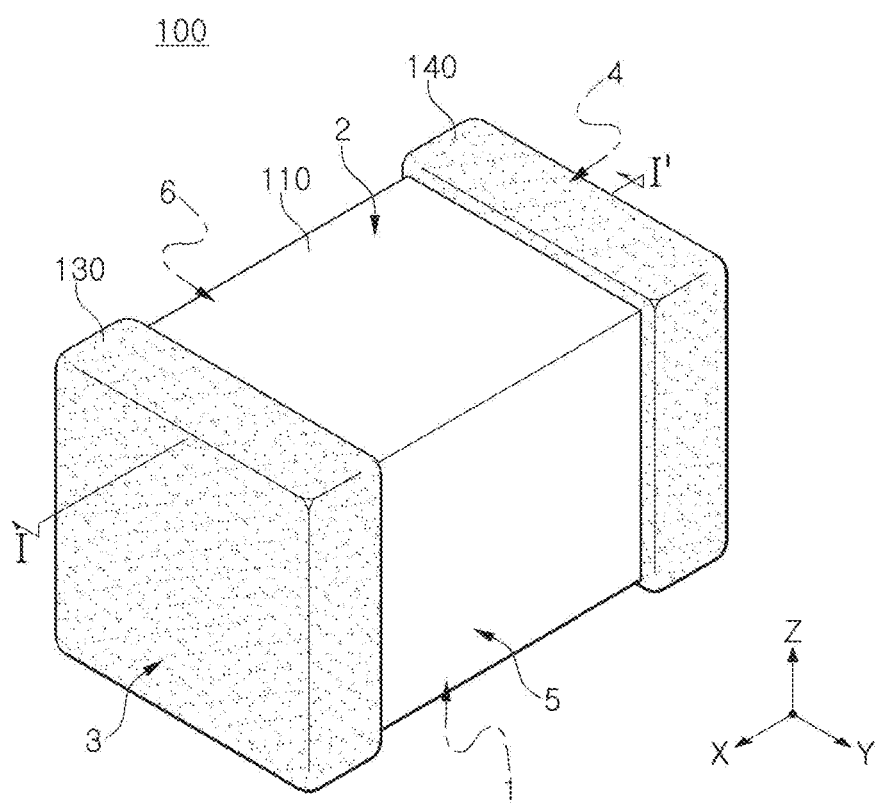
FIG. 1 is a schematic perspective view of a multilayer capacitor according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application.

Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

Hereinafter, when a direction of a capacitor body is defined to clearly describe an embodiment, X, Y and Z illustrated in the drawings represent the length direction, the width direction, and the thickness direction of the capacitor body, respectively.

Further, in the embodiment, the Z direction may be used in the same concept as the stacking direction in which the dielectric layers are stacked.

Figure 2A:
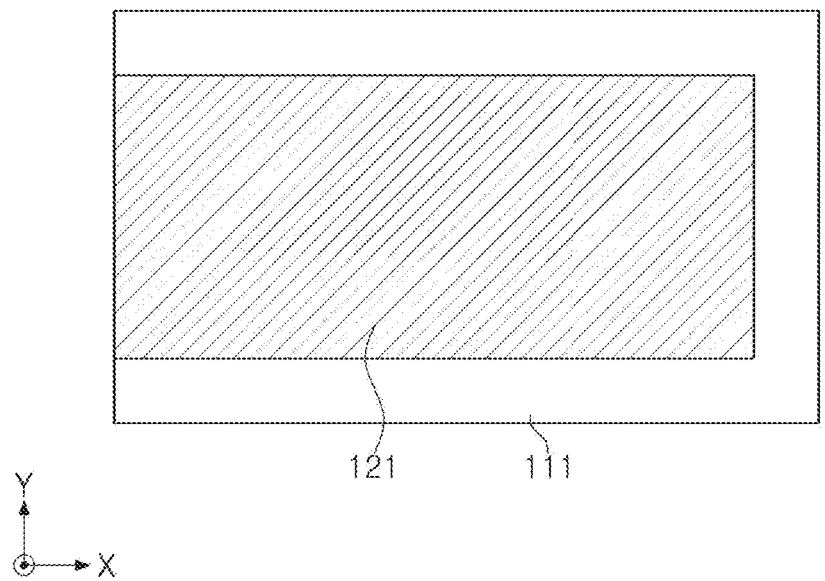
FIGS. 2A and 2B are plan views illustrating first and second internal electrodes of FIG. 1.
Figure 2B:
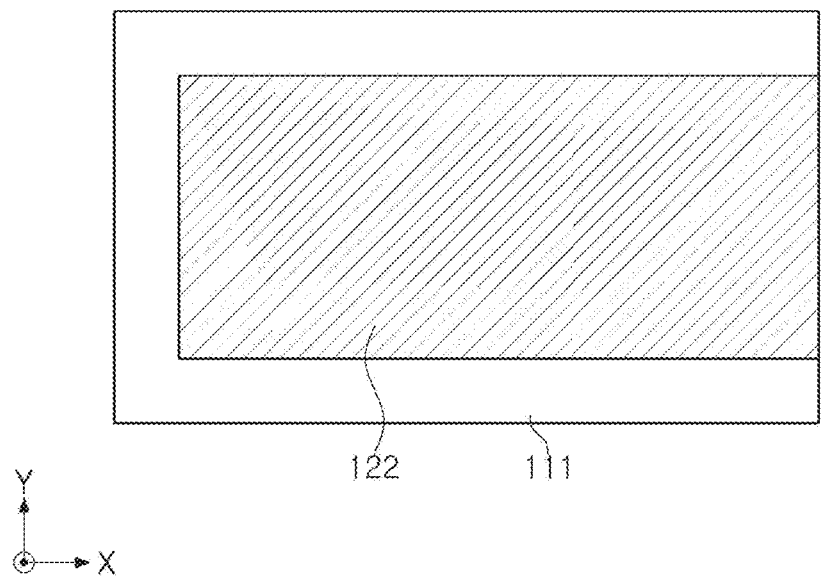
Figure 3:
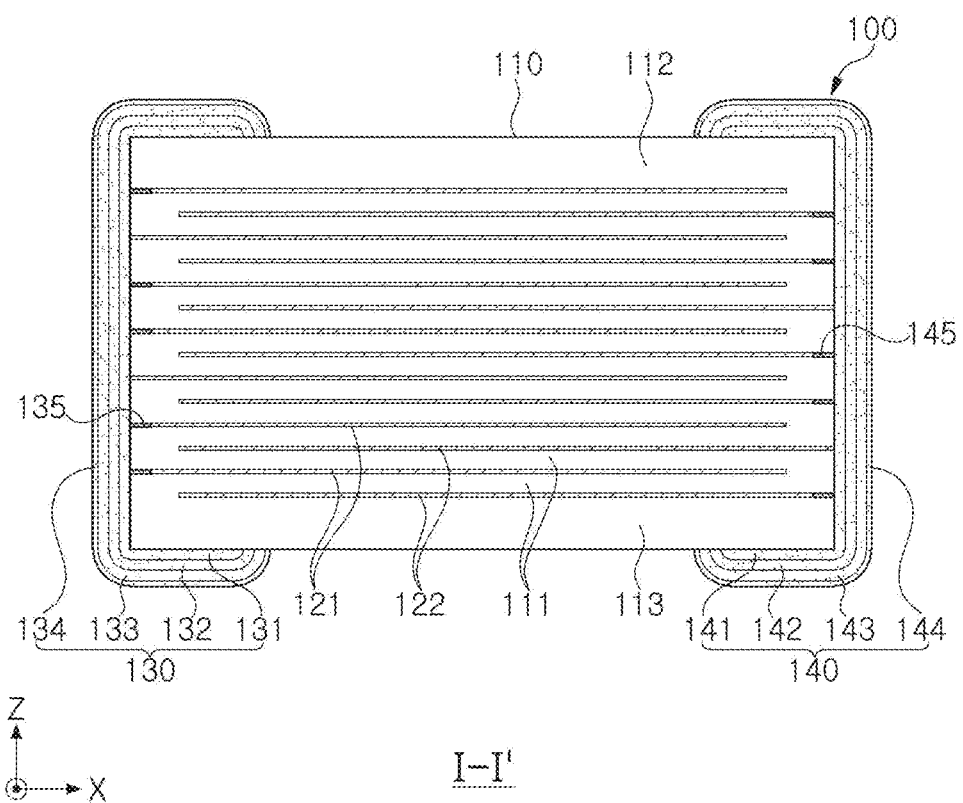
FIG. 3 is a cross-sectional view taken along line I-I' of FIG. 1.

FIG. 1 is a perspective view schematically illustrating a multilayer capacitor according to an embodiment, FIGS. 2A and 2B are plan views illustrating first and second internal electrodes of FIG. 1, and FIG. 3 is a cross-sectional view taken along line I-I' of FIG. 1.

Referring to FIGS. 1 to 3, a multilayer capacitor 100 according to an embodiment includes a capacitor body 110 and first and second external electrodes 130 and 140.

The capacitor body 110 includes a plurality of dielectric layers 111 and a plurality of first internal electrodes 121 and second internal electrodes 122 alternately disposed in the Z direction with the dielectric layer 111 interposed therebetween.

The capacitor body 110 is obtained by stacking a plurality of dielectric layers 111 in the Z direction to then be sintered, and the boundaries between adjacent dielectric layers 111 of the capacitor body 110 may be integrated to the extent that it is difficult to check without using a scanning electron microscope (SEM).

In this case, the capacitor body 110 may have a substantially hexahedral shape, but the present disclosure is not limited thereto. Further, the shape and dimensions of the capacitor body 110 and the number of stacked dielectric layers 111 are not limited to those illustrated in the drawings of this embodiment.

In this embodiment, for convenience of description, both surfaces of the capacitor body 110 opposing each other in the Z direction are defined as first and second surfaces 1 and 2, both surfaces connected to the first and second surfaces 1 and 2 and opposing each other in the X direction are defined as third and fourth surfaces 3 and 4, and both surfaces connected to the first and second surfaces 1 and 2, connected to the third and fourth surfaces 3 and 4, and opposing each other in the Y direction are defined as fifth and sixth surfaces 5 and 6.

In addition, in this embodiment, the mounting surface of the multilayer capacitor 100 may be the first surface 1 of the capacitor body 110.

The dielectric layer 111 may include a ceramic material having a high dielectric constant, for example, barium titanate (BaTiO$_3$) or strontium titanate (SrTiO$_3$)-based ceramic powder, or the like, but the present disclosure is not limited thereto.

In addition, a ceramic additive, an organic solvent, plasticizer, a binder, a dispersant, and the like may be further added to the dielectric layer 111 in addition to the ceramic powder.

As the ceramic additive, for example, a transition metal oxide or a transition metal carbide, a rare earth element, magnesium (Mg) or aluminum (Al) may be used.

The capacitor body 110 may include an active region as a portion contributing to the formation of capacitance of the capacitor, and upper and lower covers 112 and 113 formed on the upper and lower surfaces of the active region in the Z direction as upper and lower margins respectively.

The upper and lower covers 112 and 113 may have the same material and configuration as the dielectric layer 111 except that the upper and lower covers do not include internal electrodes.

The upper and lower covers 112 and 113 may be formed by stacking a single dielectric layer or two or more dielectric layers on the upper and lower surfaces of the active region in the Z direction, respectively, and may basically serve to prevent damage to the first and second internal electrodes 121 and 122 due to physical or chemical stress.

The first and second internal electrodes 121 and 122 are electrodes to which different polarities are applied, and are alternately disposed in the Z direction with a dielectric layer 111 interposed therebetween, and one ends of the first and second internal electrodes 121 and 122 may be exposed through the third and fourth surfaces 3 and 4 of the capacitor body 110, respectively.

In this case, the first and second internal electrodes 121 and 122 may be electrically insulated from each other by the dielectric layer 111 disposed therebetween.

In this manner, the ends of the first and second internal electrodes 121 and 122 alternately exposed through the third and fourth surfaces 3 and 4 of the capacitor body 110 may contact and be electrically connected to first and second external electrodes 130 and 140 disposed on the third and fourth surfaces 3 and 4 of the capacitor body 110 to be described later, respectively.

According to the above configuration, when a predetermined voltage is applied to the first and second external electrodes 130 and 140, electric charges are accumulated between the first and second internal electrodes 121 and 122.

In this case, the capacitance of the multilayer capacitor 100 is proportional to the overlapped area of the first and second internal electrodes 121 and 122 overlapping each other in the Z direction in the active region of the capacitor body 110.

In addition, a material for the formation of the first and second internal electrodes 121 and 122 is not particularly limited, and for example, the first and second internal electrodes 121 and 122 may be formed using a conductive paste formed of at least one of noble metal materials such as platinum (Pt), palladium (Pd), and palladium-silver (Pd—Ag) alloys, nickel (Ni) and copper (Cu).

In this case, the printing method of the conductive paste may be a screen-printing method, a gravure printing method, or the like, but is not limited thereto.

The first and second external electrodes 130 and 140 may be provided with voltages of different polarities, may be disposed on both ends of the capacitor body 110 in the X direction, and may be electrically connected to exposed portions of the first and second internal electrodes 121 and 122, respectively.

The first external electrode 130 may include a first connection portion and a first band portion.

The first connection portion is a part that is formed on the third surface 3 of the capacitor body 110 and connected to the exposed portion of the first internal electrode 121, and the first band portion is a part extending from the first connection portion to a portion of the first surface 1 of the capacitor body 110.

In this case, the first band portion may further extend to portions of the fifth and sixth surfaces 5 and 6 of the capacitor body 110 and a portion of the second surface 2 thereof to improve adhesion strength or the like.

The second external electrode 140 may include a second connection portion and a second band portion.

The second connection portion is a part formed on the fourth surface 4 of the capacitor body 110 and connected to the exposed portion of the second internal electrode 122, and the second band portion is a part extending from the second connection portion to a portion of the first surface 1 of the capacitor body 110.

In this case, the second band portion may further extend to portions of the fifth and sixth surfaces 5 and 6 of the capacitor body 110 and a portion of the second surface 2 thereof to improve adhesion strength.

In addition, a first intermetallic compound layer 135 is formed in a portion where the first internal electrode 121 and the first external electrode 130 are connected, and a second intermetallic compound layer 145 is formed in a portion where the second internal electrode 122 and the second external electrode 140 are connected.

In addition, the first internal electrode 121 may include nickel, and in this case, the first intermetallic compound layer 135 may include nickel-copper (Ni—Cu).

The second internal electrode 122 may include nickel, and in this case, the second intermetallic compound layer 145 may include nickel-copper (Ni—Cu).

In one exemplary embodiment, the number of the first intermetallic compound layer 135 may be more than or equal to 55% and less than 100%, preferably 55% to 99% of the total number of the first internal electrodes 121, and the number of the second intermetallic compound layer 145 may be more than or equal to 55% and less than 100%, preferably 55% to 99% of the total number of the second internal electrodes 122.

In addition, the capacitor body 110 may have a plurality of first and second grooves respectively formed between the dielectric layers 111 disposed in the Z direction, on the third and fourth surfaces 3 and 4, and the first and second intermetallic compound layers 135 and 145 may be disposed in the first and second grooves, respectively.

In addition, a depth of a portion in which the first external electrode 130 diffuses to the first internal electrode 121 in the connection portion between the first internal electrode 121 and the first external electrode 130 may be 30 µm or more, and a depth of a portion in which the second external electrode diffuses to the second internal electrode in the connection portion between the second internal electrode 122 and the second external electrode 240 may be 30 µm or more.

For example, the depth of each of the first and second grooves in the X direction may be 30 µm or more, which indicates that the length of each of the first and second intermetallic compound layers 135 and 145 in the X direction is 30 µm or more.

In addition, when the depth at which Cu of the external electrode diffuses to Ni of the internal electrode is 30 µm or more in the cross section of the portion on which the internal electrode and the external electrode are connected, the Equivalent Series Resistance (ESR) of the multilayer capacitor may be stably secured.

Herein, the "depth" of the first groove and the "depth" of the second groove may refer to an average depth of the plurality of first grooves and an average depth of the plurality of first grooves, respectively, but are not limited thereto.

The first external electrode 130 includes a first conductive resin layer 132 and a first electrode layer 131 disposed on the capacitor body 110 and contacting the first intermetallic compound layer 135.

The first conductive resin layer 132 may include a plurality of metal particles, a conductive connection portion surrounding each of the plurality of metal particles, and a base resin.

The metal particles may be at least one of copper, nickel, silver, silver-coated copper, or tin-coated copper.

The metal particles may have one of a spherical shape, a flake shape, or a mixture of a spherical shape and a flake shape.

The first conductive resin layer 132 is disposed on the first electrode layer 131, and the first electrode layer 131 is in contact with the conductive connection portion of the first conductive resin layer 132.

The first external electrode 130 may further include a first plating layer disposed on the first conductive resin layer 132.

The first plating layer may include a first nickel plating layer 133 and a first tin plating layer 134 sequentially stacked on the first conductive resin layer 132.

The second external electrode 140 includes a second conductive resin layer 142 and a second electrode layer 141 disposed on the capacitor body 110 and contacting the second intermetallic compound layer 145.

The second conductive resin layer 142 may include a plurality of metal particles, a conductive connection portion surrounding each of the plurality of metal particles, and a base resin.

The metal particles may be at least one of copper, nickel, silver, silver-coated copper, or tin-coated copper.

The metal particles may have one of a spherical shape, a flake shape, or a mixture of a spherical shape and a flake shape.

The second conductive resin layer 142 is disposed on the second conductive electrode layer 141, and the second conductive electrode layer 141 is in contact with the conductive connection portion of the second conductive resin layer 142.

The second external electrode 140 may further include a second plating layer disposed on the second conductive resin layer 142.

The second plating layer may include a second nickel plating layer 143 and a second tin plating layer 144 sequentially stacked on the second conductive resin layer 142.

In general, a multilayer capacitor is comprised of an internal electrode containing nickel and an external electrode containing copper, and Ni—Cu Intermetallic Compound (IMC) is formed at the connection portion between the internal electrode and the external electrode during sintering of the electrode, to implement the electrical characteristics of capacitors such as capacitance, DF, and ESR.

In this case, the capacitance, DF and ESR indicators of the multilayer capacitor may vary depending on the connectivity between the external electrode and the internal electrode.

In detail, the smaller the size of the multilayer capacitor is and the lower the capacity is, the smaller the area of the electrode and the smaller the number of layers of the internal electrode is, and thus, the contact property between the internal electrode and the external electrode may further decrease.

In addition, in the case of electric multilayer capacitors, a copper electrode is applied as a primary electrode, and an epoxy-copper electrode is applied as a secondary electrode to secure bending strength. This secondary electrode has relatively low electrical conductivity, such that the connection between internal and external electrodes may be further lowed.

In an embodiment of the present disclosure, in a product having a small size and low-capacity with low electrode connectivity, in detail, a product having a size of 1.0 mm×0.5 mm or less in the length in the X direction×the width in the Y direction, with a small chip size for electronic devices, the degree of connectivity of internal and external electrodes is numerically represented, and thus, the predictive effectiveness of ESR, electrical characteristics, is described.

In the following experiment, after adjusting the oxidizing and reducing atmosphere by changing the Wetter condition of the electrode sintering furnace (moisture supply), the degree of IMC formation of the multilayer capacitor was correlated with ESR, and an appropriate value for the formation of IMC effective in predicting ESR was determined.

TABLE 1

| | ESR test conditions | |
| Capacitance | Measuring Instrument | Frequency |
| --- | --- | --- |
| less than 1 nF | E4990 | 100 Mhz |
| 1 nF or more-less than 10 nF | | 25 Mhz |
| 10 nF or more-less than 100 nF | | 10 Mhz |
| 100 nF or more-less than 1 uF | E4980 | 1 Mhz |
| 1 uF or more | | |

In this test, 3 or more IMC formations of Cu—Ni at the center of the ×1500 cross-section in the SEM image, for a sample of small size (length in X direction×width in Y direction is 1.0 mm×0.5 mm or less), were counted and measured. In this case, ESR is measured according to the frequency as illustrated in Table 1, using a measuring instrument for each capacity.

TABLE 2

| # | Ratio of number of internal and external electrodes connected (%) | ESR [mΩ] Avg. | ESR [mΩ] Max. |
|---|---|---|---|
| 1 | Less than 50 | >300 | >300 |
| 2 | 50 or more and less than 55 | 120 | 200 |
| 3 | 55 or more and less than 60 | 22 | 25 |
| 4 | 60 or more and less than 65 | — | — |
| 5 | 65 or more and less than 70 | — | — |
| 6 | 70 or more and less than 75 | — | — |
| 7 | 75 or more and less than 80 | 22 | 23 |
| 8 | 80 or more and less than 85 | 22 | 25 |
| 9 | 85 or more and less than 90 | — | — |
| 10 | 90 or more and less than 95 | — | — |
| 11 | 95 or more and less than 100 | 21 | 23 |

Referring to Table 2, it can be seen that in #3-11 in which the ratio of the number of connections between the internal electrode and the external electrode to the number of internal electrodes at cross-section SEM ×1500 3-points of a part where the internal and external electrodes are connected, for example, the ratio of the formation of intermetallic compound (e.g., a ratio of the total number of intermetallic compound layers to the total number of the internal electrodes), is 55% or more, the ESR of the multilayer capacitor may be stably secured.

TABLE 3

| # | Ratio of average thickness of connection portion between internal electrode and external electrode with respect to average thickness of internal electrode (%) | ESR [mΩ] Avg. | ESR [mΩ] Max. |
|---|---|---|---|
| 12 | Less than 30 | >300 | >300 |
| 13 | 30 or more and less than 40 | 120 | 200 |
| 14 | 40 or more and less than 50 | 70 | 120 |
| 15 | 50 or more and less than 60 | 21 | 23 |
| 16 | 60 or more and less than 70 | — | — |
| 17 | 70 or more and less than 80 | — | — |
| 18 | 80 or more and less than 90 | 21 | 23 |
| 19 | 90 or more and less than 100 | — | — |

Figure 4:
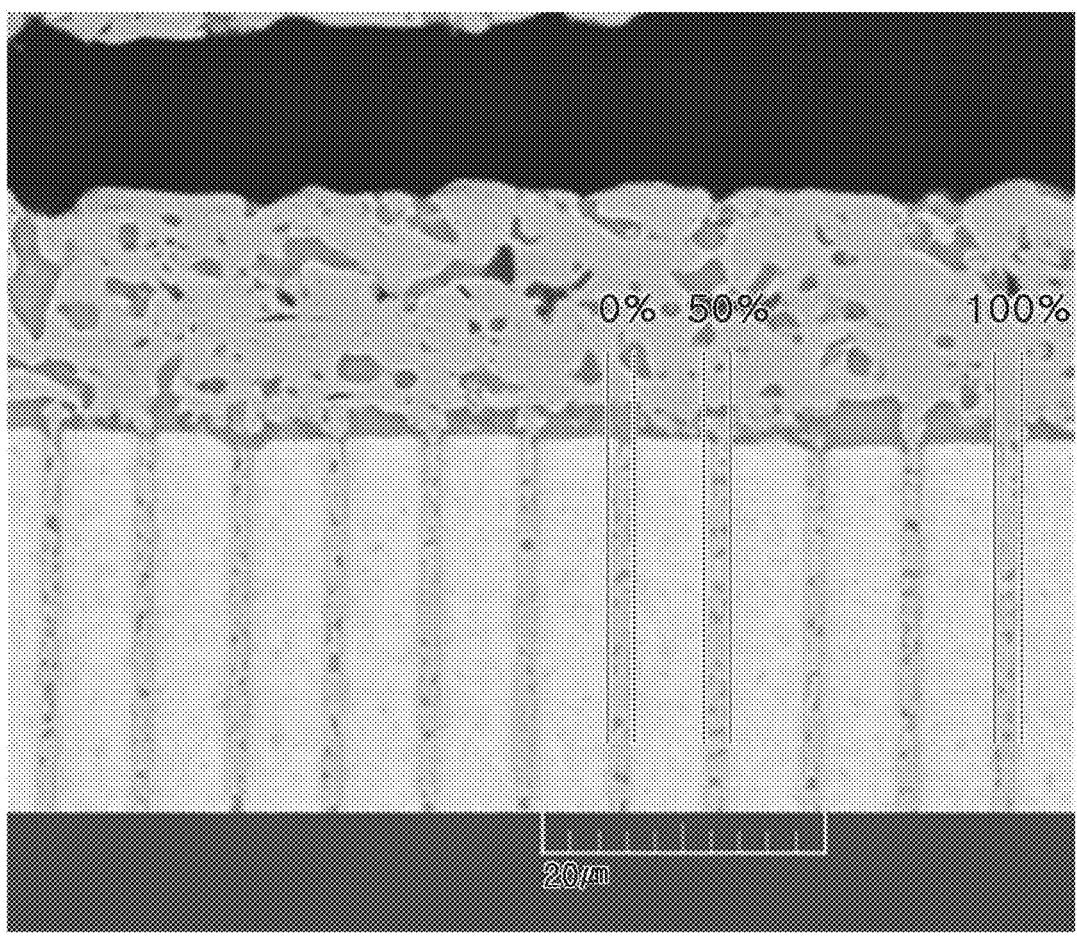
FIG. 4 is an SEM image illustrating the ratio of a thickness of a connection portion between an internal electrode and an external electrode to a thickness of the internal electrode.

Referring to Table 3 and FIG. 4, it can be seen that when an average thickness of a connected portion between an internal electrode and an external electrode, at cross-section SEM ×3000 3-points of a portion where the internal electrode and the external electrode are connected, is 50% or more of an average thickness of the internal electrode, the ESR of the multilayer capacitor may be stably secured. In the present specification, the term "thickness" may refer to a thickness of a certain member measured in a direction perpendicular to a surface of the member, and the term "average thickness" may refer to an arithmetic average of thicknesses of the member measured at a predetermined number of points, having an equal interval therebetween, in a cross section of the multilayer capacitor taken along a direction parallel to the planar surface of the member, e.g., the Y axis in FIG. 3, while passing through the center of the multilayer capacitor. The measurement of an average thickness is not limited to these examples, and one of ordinary skill may select the number of measurement points, the interval between the measurement points, and so forth, if needed. For example, the number of measurement points may be 3, 5, or 10 per one member, but is not limited thereto. The average thickness of the member may refer to an average value of average thicknesses of the plurality of members if the member is provided in plural in the multilayer capacitor. The measurement of the thickness for each measurement point may be done by using a microscopy image, for example, a scanning electron microscope (SEM) image, but is not limited thereto.

Figure 5:
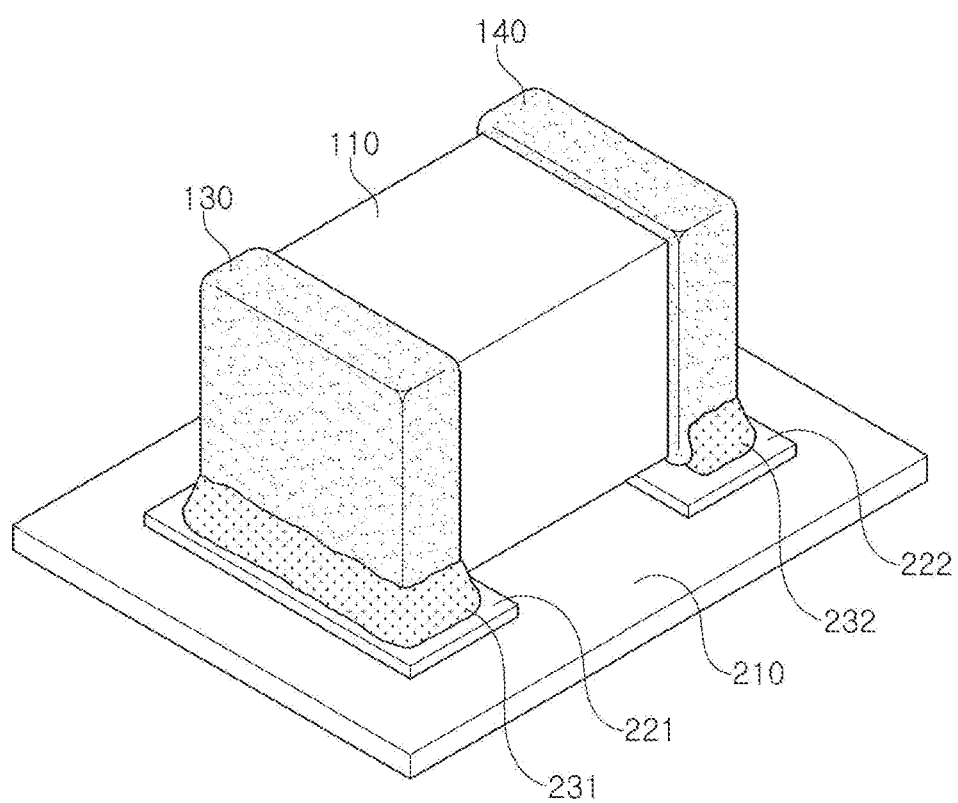
FIG. 5 is a perspective view schematically illustrating a mounting structure of a multilayer capacitor and a substrate according to an embodiment.

FIG. 5 is a perspective view schematically illustrating a mounting structure of a multilayer capacitor and a substrate according to an embodiment.

Referring to FIG. 5, a board having a multilayer capacitor mounted thereon, according to an embodiment, includes a substrate 210 on which a multilayer capacitor 100 is mounted, and first and second electrode pads 221 and 222 disposed to be spaced apart from each other on an upper surface of the substrate 210.

The multilayer capacitor 100 is connected and mounted on the substrate 210 in a state in which the first and second external electrodes 130 and 140 are located to be in contact with the first and second electrode pads 221 and 222, respectively.

In this case, the first external electrode 130 may be bonded to the first electrode pad 221 by a solder 231 to be electrically and physically connected thereto, and the second external electrode 140 may be bonded to the second electrode pad 222 by a solder 232 to be electrically and physically connected thereto.

In this case, the multilayer capacitor 100 is the multilayer capacitor according to an embodiment of the present disclosure described above, and detailed descriptions thereof will be omitted to avoid redundancy.

As set forth above, according to an embodiment, there is an effect of lowering ESR while preventing cracking of a multilayer capacitor.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer capacitor comprising:
    a capacitor body including a plurality of dielectric layers and a plurality of internal electrodes alternately disposed with each of the plurality of dielectric layers interposed therebetween; and
    an external electrode disposed on the capacitor body to be connected to the plurality of internal electrodes,
    wherein at least one intermetallic compound layer is disposed in a region in which the plurality of internal electrodes and the external electrode are connected,
    a total number of the at least one intermetallic compound layer is more than or equal to 55% and less than 100% of a total number of the plurality of internal electrodes, and a ratio of an average thickness of the at least one intermetallic compound layer to an average thickness of an internal electrode is 50% or more and less than 90%.

2. The multilayer capacitor of claim 1, wherein the total number of the at least one intermetallic compound layer is 55% to 99% of the total number of the plurality of internal electrodes.

3. The multilayer capacitor of claim 1, wherein the capacitor body comprises first and second surfaces opposing each other in a first direction, third and fourth surfaces opposing each other in a second direction, perpendicular to the first direction, and fifth and sixth surfaces opposing each other in a third direction, perpendicular to the first and second directions,
    wherein in the third and fourth surfaces of capacitor body, a plurality of grooves are disposed between the dielectric layers disposed in the first direction, and
    the at least one intermetallic compound layer is disposed in the grooves.

4. The multilayer capacitor of claim 3, wherein an average depth of the plurality of grooves is 30 μm or more.

5. The multilayer capacitor of claim 1, wherein an average depth of portions of the external electrode that diffuse to the plurality of internal electrodes, on connection portions between the plurality of internal electrodes and the external electrode, is 30 μm or more.

6. The multilayer capacitor of claim 1, wherein the external electrode comprises:
    an electrode layer disposed on the capacitor body and in contact with the at least one intermetallic compound layer; and
    a conductive resin layer disposed on the electrode layer and including a plurality of metal particles, a conductive connection portion surrounding each of the plurality of metal particles and contacting the electrode layer, and a base resin.

7. The multilayer capacitor of claim 6, wherein the plurality of metal particles of the conductive resin layer include at least one of copper, nickel, silver, silver-coated copper, or tin-coated copper.

8. The multilayer capacitor of claim 6, wherein the plurality of metal particles of the conductive resin layer have one of a spherical shape, a flake shape, or a mixture of the spherical shape and the flake shape.

9. The multilayer capacitor of claim 6, wherein the external electrode further comprises a plating layer disposed on the conductive resin layer.

10. The multilayer capacitor of claim 9, wherein the plating layer comprises a nickel plating layer and a tin plating layer, sequentially stacked on the conductive resin layer.

11. The multilayer capacitor of claim 1, wherein each of the plurality of internal electrodes includes nickel, and the at least one intermetallic compound layer includes nickel-copper (Ni—Cu).

12. A board having a multilayer capacitor mounted thereon, the board comprising:
    a substrate having a plurality of electrode pads on one surface of the substrate; and
    the multilayer capacitor of claim 1, mounted on the substrate, wherein the external electrode is connected to the plurality of electrode pads.

* * * * *